US008099708B2

(12) United States Patent
Lindberg et al.

(10) Patent No.: US 8,099,708 B2
(45) Date of Patent: Jan. 17, 2012

(54) I/O PLANNING WITH LOCK AND INSERTION FEATURES

(75) Inventors: Grant Lindberg, Pleasanton, CA (US); Gregor J. Martin, Mountain View, CA (US); David Asson, Sisters, OR (US); Ying Chun He, Milpitas, CA (US)

(73) Assignee: LSI Corporation, Milpitas, CA (US)

( * ) Notice: Subject to any disclaimer, the term of this patent is extended or adjusted under 35 U.S.C. 154(b) by 363 days.

(21) Appl. No.: 12/432,996

(22) Filed: Apr. 30, 2009

(65) Prior Publication Data

US 2009/0210846 A1 Aug. 20, 2009

Related U.S. Application Data

(62) Division of application No. 11/115,798, filed on Apr. 27, 2005, now Pat. No. 7,543,261.

(51) Int. Cl.
*G06F 17/50* (2006.01)
*G06F 15/04* (2006.01)

(52) U.S. Cl. ....................................................... 716/139
(58) Field of Classification Search ................... 716/139
See application file for complete search history.

(56) References Cited

U.S. PATENT DOCUMENTS

| | | | |
|---|---|---|---|
| 6,063,132 A | 5/2000 | DeCamp et al. | 716/5 |
| 7,076,751 B1 | 7/2006 | Nixon et al. | 716/5 |
| 7,100,139 B1 | 8/2006 | Andeson et al. | 716/11 |
| 7,299,444 B1* | 11/2007 | Tai et al. | 716/117 |
| 2005/0071715 A1* | 3/2005 | Kolman | 714/724 |
| 2005/0086626 A1* | 4/2005 | Sato et al. | 716/11 |
| 2005/0188336 A1 | 8/2005 | Mortensen et al. | 716/5 |
| 2006/0041853 A1* | 2/2006 | Kawasaki et al. | 716/11 |
| 2006/0075372 A1 | 4/2006 | Gryba | 716/11 |
| 2007/0245276 A1* | 10/2007 | Imada et al. | 716/5 |

* cited by examiner

*Primary Examiner* — Suresh Memula
(74) *Attorney, Agent, or Firm* — Christopher P. Maiorana, PC (57) ABSTRACT

A method of operation for an input/output assignment tool is disclosed. The method generally includes the steps of (A) generating a graphic presentation to a user displaying (i) a circuit icon having a plurality of pin icons and (ii) a plurality of signal icons, (B) moving a first of the signal icons within the graphic presentation to a first of the pin icons in response to a move command from the user and (C) indicating an acceptance of an association between the first signal icon and the first pin icon in response to the association passing a rule.

19 Claims, 12 Drawing Sheets

I/O PLANNING WITH LOCK AND INSERTION FEATURES

This is a divisional of U.S. Ser. No. 11/115,798, filed Apr. 27, 2005, now U.S. Pat. No. 7,543,261 which is incorporated by reference.

FIELD OF THE INVENTION

The present invention relates to electronic circuit signal-to-pin assignments generally and, more particularly, to input/output planning with lock and insertion features.

BACKGROUND OF THE INVENTION

Designers often change a physical location of one or more input/output (I/O) signals during a design project. For example, the designers may move a bus from one side of a die to the other. To enable the bus move, other I/O signals that have already been assigned a physical location need to be moved to make room for the bus. However, some I/O assignments cannot be moved. Certain I/O signals need to maintain at an existing location due to various criteria such as board layout and power segment locations.

A common approach to inserting and moving signal-to-pin assignments is to manually reassign existing signals at the destination to make room for newly inserted or moved signals. The manual approach can be tedious and time consuming. Furthermore, the manual approach usually does not offer the designers a two-dimensional top-down or bottom-up view of which signals are assigned to which pins.

SUMMARY OF THE INVENTION

The present invention concerns a method of operation for an input/output assignment tool. The method generally comprises the steps of (A) generating a graphic presentation to a user displaying (i) a circuit icon having a plurality of pin icons and (ii) a plurality of signal icons, (B) moving a first of the signal icons within the graphic presentation to a first of the pin icons in response to a move command from the user and (C) indicating an acceptance of an association between the first signal icon and the first pin icon in response to the association passing a rule.

The objects, features and advantages of the present invention include providing an input/output assignment tool with lock and insertion features that may (i) provide a graphic illustration of the signal-to-pin assignments, (ii) allow a user to lock and unlock assignments, (iii) group signals for easy insertion and/or movement, (iv) provide automatic rule verification and/or enforcement for each assignment, (v) provide automatic rule verification and/or enforcement within power segments and/or (vi) automatically move unlocked signals to make room for other signals.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention generally concerns a placement (or assignment) tool for signal-to-pin assignments. The assignment tool may provide a user with a two-dimensional graphical approach to both move and insert individual input/output (I/O) signals or groups of I/Os in new locations. Each of the I/O signals may be represented by a signal icon in a graphical presentation. Each of the locations may be represented by a pin icon in the graphical representation. Assignments between the signal icons (e.g., signal) and the pin icons (e.g., pins) may be manipulated both (i) manually by the user and (ii) automatically within a defined set of rules useful for floor planning.

The floor planning may be for a chip (or die) and/or integrated circuit package. Floor planning at the package level may include signals from more than one chip. The signal icons may represent any type of signal such as power signals, ground signals, clock signals, reference signals, fixed input signals, digital signals, analog signals, voltage signals, current signals, frequency signals and the like. The pin icons may represent any type of input/output interface mechanism such as straight pin interfaces, ball interfaces, tab interfaces, wire bonds, coaxial interfaces, triaxial interfaces, optical interfaces and the like.

The set of rules may provide that an association between I/Os (e.g., signal icons) and locations (e.g., pin icons) may have a characteristic (or state) of locked or unlocked. A physical location of an old I/O that may already be assigned to, but unlocked to a particular location, may be automatically changed to allow room for a user-inserted new I/O at the particular location. If the old I/O at the particular location has been previously locked by the user, then the locked old I/O may remain at the particular location when the user attempts to assign the new I/O. If the user attempts to insert new I/Os in a locations where all of the old I/Os have been locked, the new I/Os may be inserted in closest unlocked locations. Locking and unlocking may be controlled by the user.

The signal icons (I/O) being moved may be selected by the user from one or more sources within the graphical presentation (display). A selected signal icon may have an existing association with a pin icon when selected by the user for a move. Thus, a signal icon may be moved from (disassociated) a current pin icon to (associated) a new pin icon. Other signal icons may be selected from a list of unassigned signal icons. An unassigned signal icon may be moved from the list to the new pin icon. Conversely, a previously assigned signal icon may be moved from the associated pin icon back to the list of unassigned icons for temporary storage.

The set of rules may permit the pin icons and the signal icons to have one or more among multiple types of characteristics. For example, a pin icon may be designated as either (i) a user type of pin icon or (ii) a nonuser type of pin icon. User types of pin icons may accept user-defined associations (e.g., drag and drop) with either (i) all types signal icons or (ii) only user types of signal icons. Nonuser types of pin icons may have permanent assignments to particular signal types (e.g., power and ground). Another characteristic type generally includes a power segment type (e.g., 1.8 volts, 2.5 volts, 3.3 volts, 5 volts, VCC, VDD, VSS, ground, etc.) The power segment rules may prevent a user from accidently attaching an output signal icon to a 3.3 volt power pin icon or some other undesirable combination of signal icons and pin icons. The power segment rules may also warn and/or prevent the user from placing a low voltage (e.g., 1.8 volts) based signal icon and/or pin icon among high voltage (e.g., 5 volts) based signal icons and/or pin icons, or vice versa.

The set of rules may provide grouping and ungrouping of the signal icons and/or the pin icons. For example, the user may group a set of signal icons, then quickly drag and drop the signal group onto a corresponding group of pin icons at a new location with a single command. The drag and drop may be operational to maintain certain types of previously assigned signal icon/pin icon pairs unchanged at the target location. Certain signal icons may also be entered into the assignment tool with preestablished groupings. For example, all of the data, address and control signals of a bus may be automatically grouped as a single interface by the present invention without interaction from the user. Example groupings may include, but are not limited to, a 32-bit Advanced High-Speed Bus (AHB) address vector (e.g., HADDR[31:0]) and an entire standard 32-bit AHB bus with over 100 individual signals.

Figure 1:
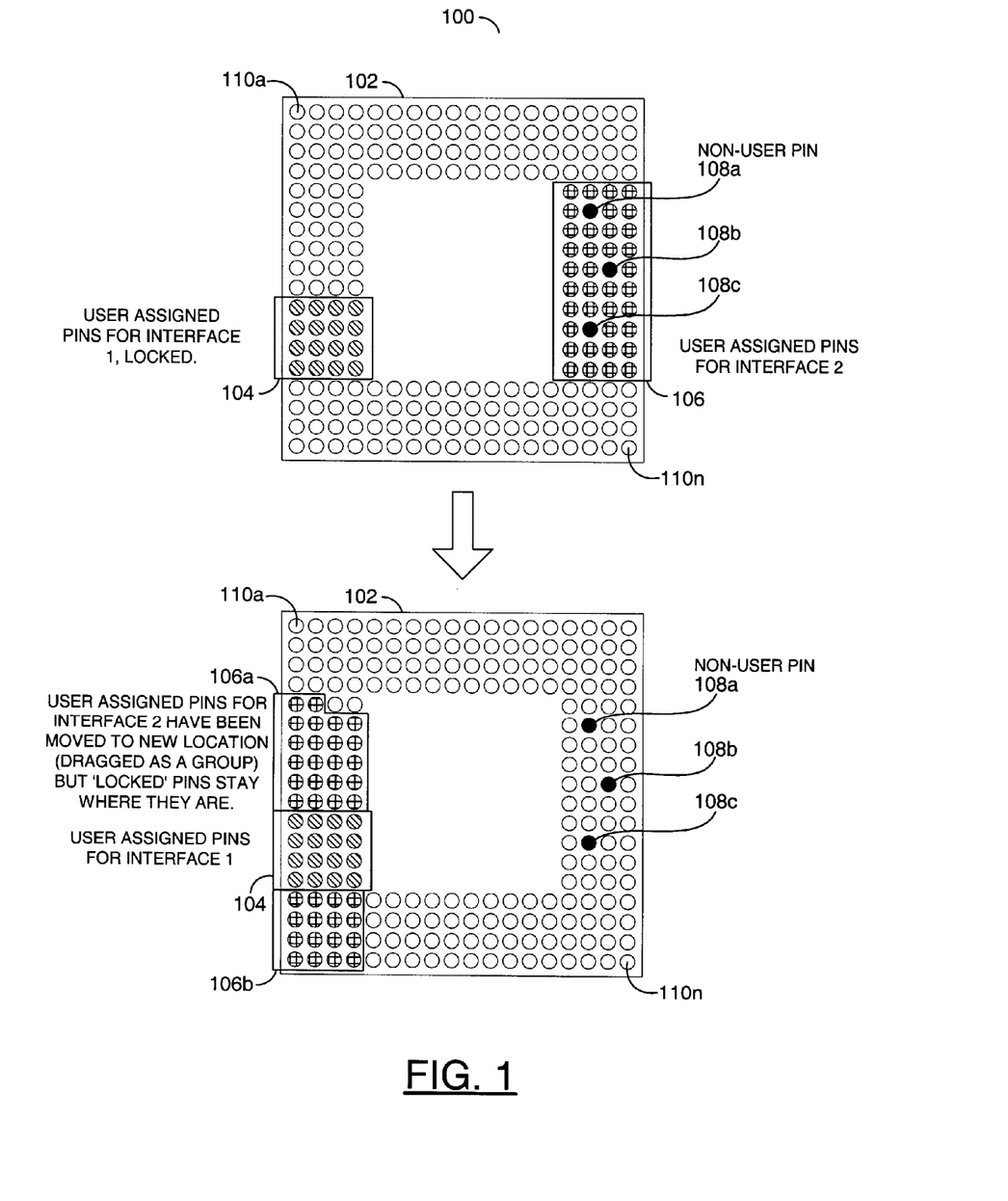
FIG. 1 is a diagram of an example move of a group of signal icons in accordance with a preferred embodiment of the present invention.

Referring to FIG. 1, a diagram of an example move 100 of a group of signal icons is shown in accordance with a preferred embodiment of the present invention. A package 102 may have a first group of signal icons 104 (e.g., INTERFACE 1), a second group of signal icons 106 (e.g., INTERFACE 2), multiple nonuser pin icons 108a-108c and multiple unassigned pin icons 110a-110n A user may decided to move the INTERFACE 2 signal icons 106 to a lower left-hand side of the package 102, partially occupied by the INTERFACE 1 pin icons 104. However, the INTERFACE 1 signal icons 104 may be locked. Therefore, the INTERFACE 2 signal icons 106 may be automatically reassigned to the nearest available pins icons 110a-110n as part of the move. The automatic reassignment may split the INTERFACE 2 signal icons 106 into two sets 106a-106b. The two sets 106a and 106b may be physically separated from each other by the INTERFACE 1 signal icons 104.

If a signal icon or interface group icon has been placed then locked, the assignment tool generally stops any further changes from accidentally moving the locked icons. Therefore, the assignment tool may provide an easy method for the user to manipulate signal-to-pin assignments. By allowing locking of select signal icons to pin icons, other signal icons and interface group icons may be quickly manipulated without a concern for affecting assignments that have been locked. The graphical presentation may also permit the user easily to see pin icons that are not user assignable.

Several reasons generally exist to lock signal icons with pin icons. For example pin/pad icon pairs for power or ground may not have a user-defined signal applied and thus may always be locked. User type pin icons that may take any signal icon may also be locked, allowing the user to assign and lock a selected signal icon to prevent accidental reassignment.

A group of signal icons could be a bus (e.g., a vector array of 32 data bits forming a 32-bit wide data bus) or an interface, such as a full Advanced Microcontroller Bus Architecture (AMBA) bus comprising address signals, data signals, write enable signals, etc. For simple vector busses, the assignment tool may be operational to perform auto-reordering/assignments of the bits that form the vector. For example, signal icons for vector signals 0-31 may be automatically reordered and assigned to pin icons from top to bottom, bottom to top, left to right or right to left in the design.

The set of rules may know about assignment rules for complex I/O interfaces (e.g., checking of validity for certain signals, etc.). The assignment rules may know that a certain pin icon represents a high-speed source synchronous signal and thus an immediately adjacent pin icon should be assigned to a user-type signal icon dedicated as either VDD or VSS. Multiple placement rules may be built to affect the behavior of signal and signal group placements to ensure that valid and complete I/O assignments are made. Building the assignment rules into the assignment tool (optionally with contextual help to explain to the user why the assignment tool is behaving in a certain way) generally allows the user to make better assignment decisions that with conventional techniques and avoid performing assignments that may violate the rules.

Figure 2:
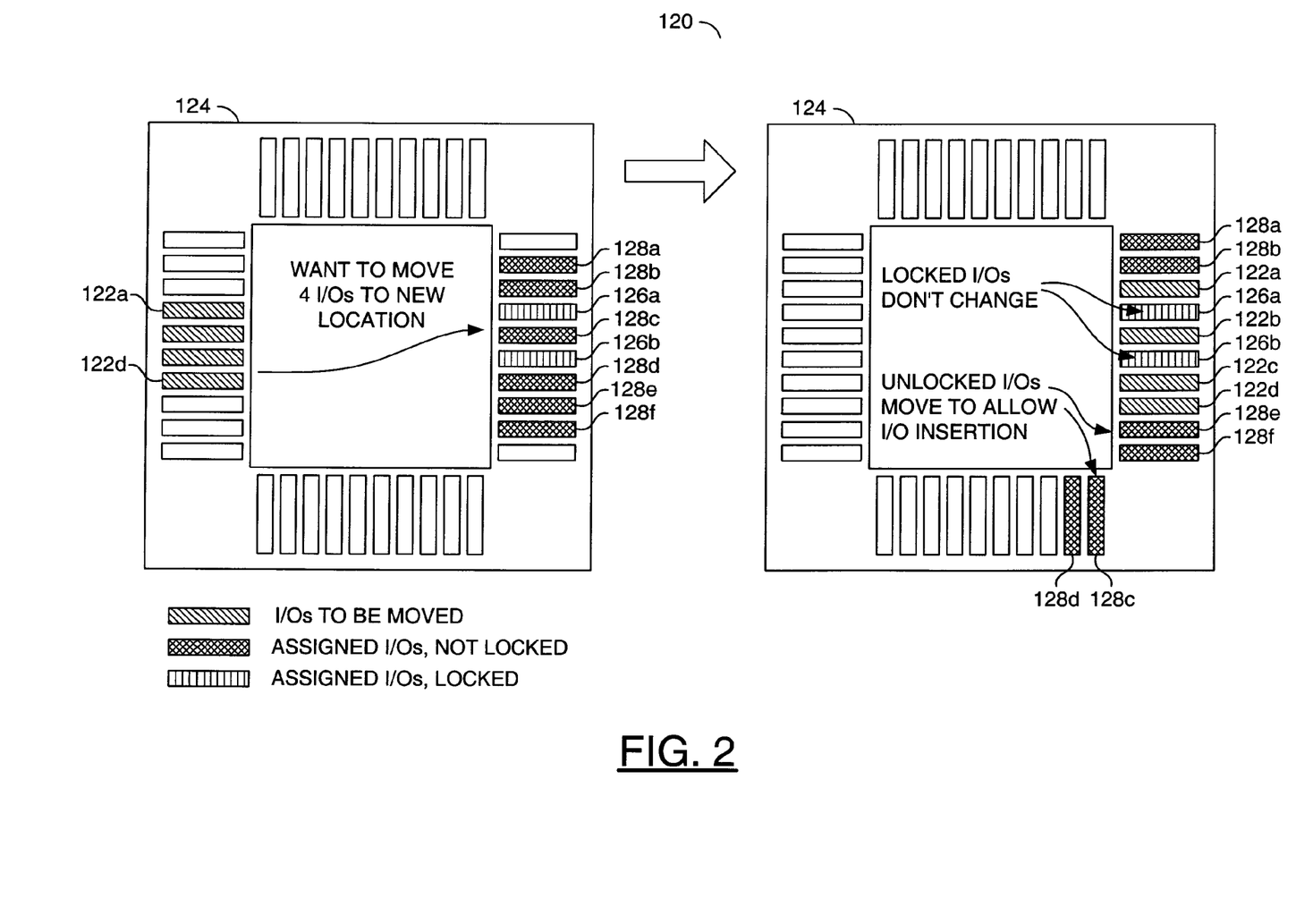
FIG. 2 is a diagram of another example move.

Referring to FIG. 2, a diagram of another example move 120 is illustrated. The move 120 may reallocate adjacent signals icons 122a-122d from a current position on a left side of a chip 124 to a right side of the chip 124. The right side of the chip 124 may have two assigned/locked signal icons 126a-126b and multiple assigned/unlocked signal icons 128a-128f. The user move may result in (i) the locked signal icons 126a-126b remaining disposed among the moved signal icons 122a-122d and (ii) several unlocked signals icons 128c-128d reallocating to unassigned pin icons along the bottom of the chip 124.

Referring to FIG. 3 and FIGS. 4A-4E, a flow diagram of an example method 140 of operating for the assignment tool is shown (FIG. 3) and diagrams of example display snapshots (or graphic presentations) 170a-170e generated by the assignment tool are shown (FIGS. 4A-4E). The method 140 generally comprises a step (or block) 142, an optional step (or block) 144, a step (or block) 146, a step (or block) 148, a step (or block) 150, a step (or block) 152 and a step (or block) 154. The snapshot 170a may illustrate an initial selection operation. The snapshot 170b may illustrate a move operation. The snapshot 170c may illustrate a place operation and a rule check operation. The snapshot 170d may illustrate an indication operation. The snapshot 170e may illustrate an override operation.

Figure 3:
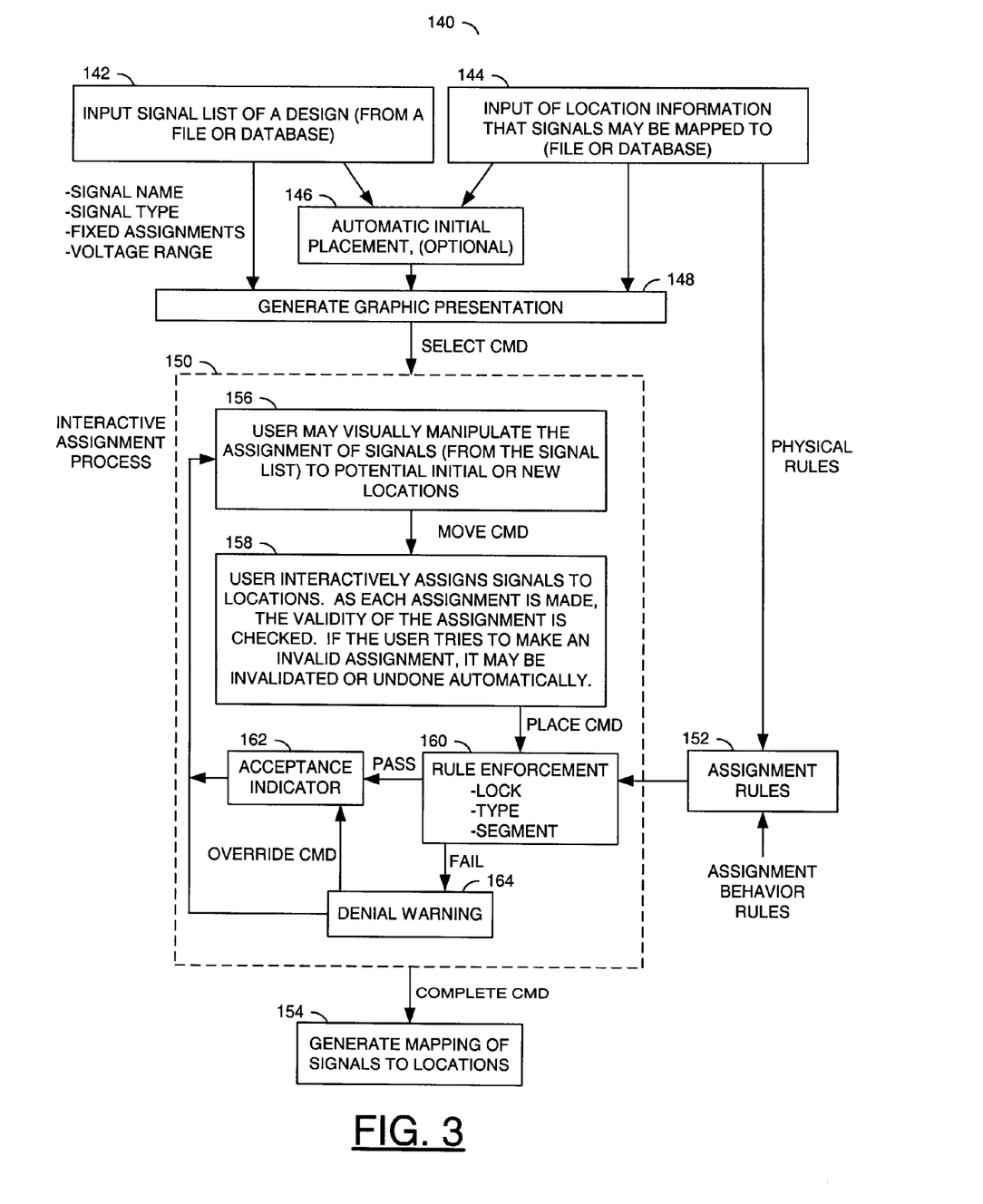
FIG. 3 is a flow diagram of an example method of operation for an assignment tool.

The method 140 may start by reading (i) an input signal list of a design from a file and/or database in step 142 and (ii) input location information to which the signals may be mapped from another file and/or database in step 144. An automatic initial placement of the signals to the locations (pins) may be performed at the optional step 146.

Figure 4A:
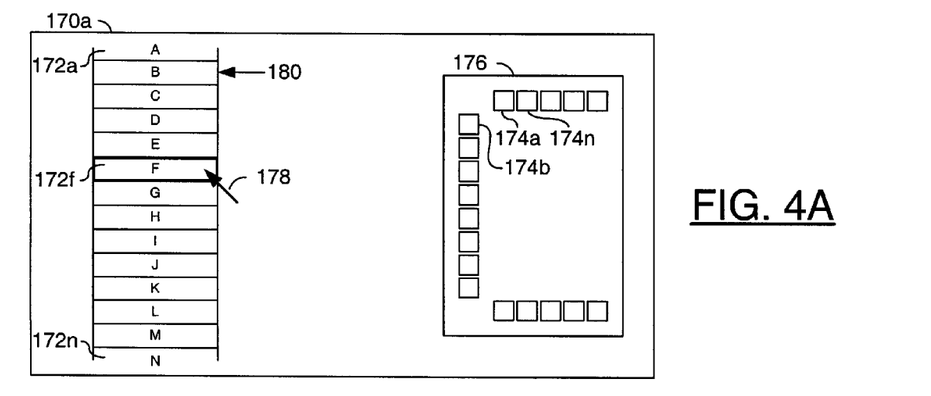
FIGS. 4A-4E are diagrams of example display snapshots generated by the assignment tool for the method of operation.

A two-dimensional graphical representation of the signals, pins and a chip or package may be generated by the step 148, as shown in snapshot 170a. The representation generally comprises (i) a signal icon 172a-172n for each individual signal read from the file/database, (ii) a pin icon 174a-174n for each individual interface location read from the file/database, (iii) a chip/package icon 176, (iv) an arrow icon 178 and (v) an optional list 180 holding any unassigned signal icons 172a-172n. The signal icons 172a-172n initially assigned by the step 146 may be displayed as already associated with a respective pin icon 174a-174n and thus absent from the list 180. Hereafter, the signal icons 172a-172n may be generally referred to as signal icons 172 and the pin icons 174a-174n may be generally referred to as pin icons 174.

The assignment tool may be operational in the step 150 to provide an interactive signal-to-pin assignment capability to the user. The user may issue a series of commands to the assignment tool to move, place, lock, unlock, group, ungroup and override rule violations for various individual signal icons and signal group icon assignments. The assignments may be checked against a set of rules generated by an assignment rule step 152. The assignment rule step 152 may create the set of rules based on physical rules received from the file and/or database and assignment behavior rules read from a file and/or database. Once all of the assignments have been completed (e.g., the user issues a COMPLETE command), the assignment tool may generate a mapping of the signals to the locations in the form of an output file and/or database in step 154.

The assignment step 150 generally comprises a step (or block) 156, a step (or block) 158, a step (or block) 160, a step (or block) 162 and a step (or block) 164. The step 156 may enable the user to visually select a signal icon or group of signal icons for manipulation. The step 156 may be initiated by the user placing the cursor 178 over a particular signal icon 172 (e.g., 172f) and issuing a command (e.g., SELECT) as illustrated in snapshot 170a. The selected signal icon 172f may be highlighted (e.g., bold boundary) to indicate to the user that the selection has been made.

Figure 4B:
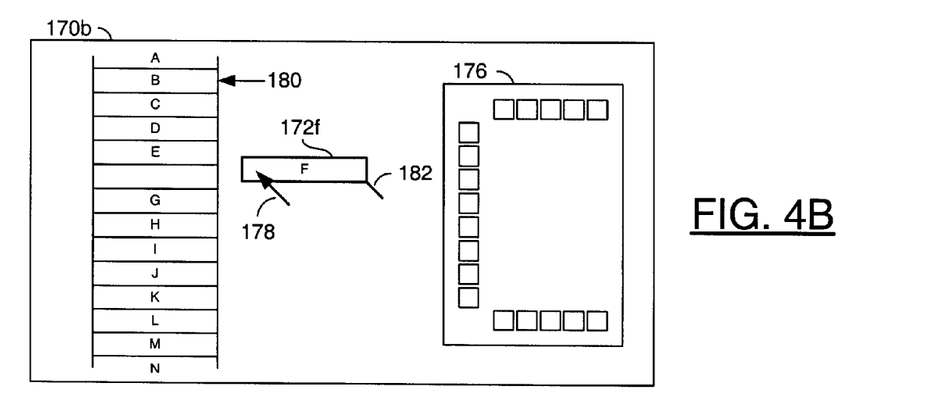

The user may propose an assignment between the selected signal icon (and the underlying respective signal) or a group of signal icons to a pin icon or pin icons (and the underlying respective pins) in the step 158 using a command (e.g., MOVE). The command MOVE may move the selected icon/signal group from either the list 180 or from currently assigned pins icons to the proposed pin icon/pin group. The command MOVE may be implemented, for example, as a left mouse click, hold and drag operation. While in transit, the selected signal icon 172f may include a reference line 182 indicating a precise location for placement of the signal icon 172f as illustrated in FIG. 4B.

Figure 4C:
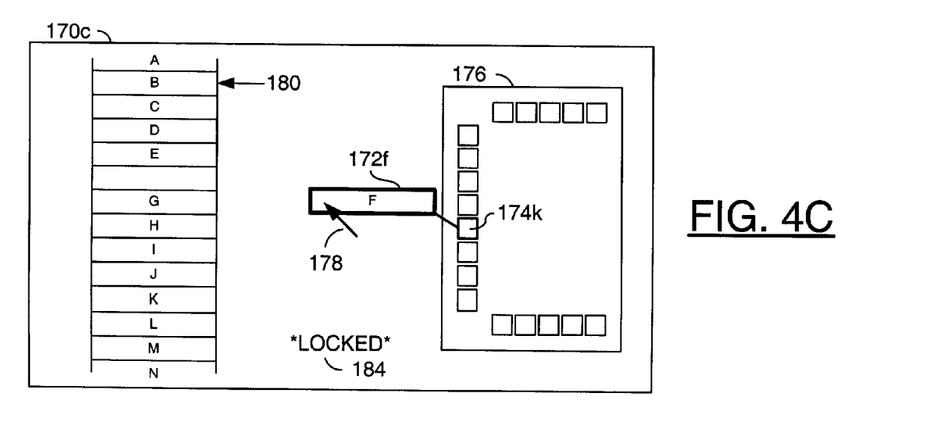

Once the signal icon/signal group has reached a target pin icon/pin group (e.g., pin icon 174k), the target pin icon/pin group may be highlighted, as shown in FIG. 4C. The highlighting may be implemented as a bold boundary around the selected pin icon/pin group. The user may then issue a command (e.g., PLACE) to indicate to the assignment tool that the user wishes to associate the signal icon/signal group with the current pin icon/pin group. The command PLACE may be implemented, for example, as a left mouse click release operation.

The assignment tool may perform one or more rule checks prior to allowing the association between the selected signal icon/signal group and the target pin icon/pin group in the step 160. If the rule check fails, the assignment tool may generate a warning or message 184 to the user in step 162. For example, if the target pin icon 174k is already locked to another signal icon 172, the assignment tool may generate a message 184 "LOCKED".

Figure 4D:
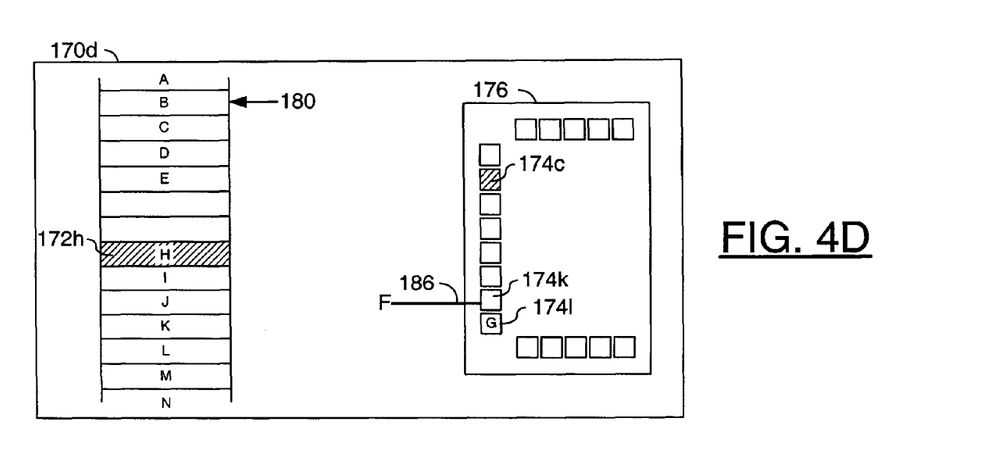

If all of the rules pass, the assignment tool may generate an acceptance indication to the user. The acceptance indication may take on several different forms, depending upon the density of the pin icons 174 and the resolution of the graphic representation. For example, acceptance may be indicated by a line 186 linking the selected signal name (e.g., "F") to the target pin icon 174k, as illustrated in FIG. 4D. In another embodiment, a signal icon name (e.g., G) may be disposed within a pin icon 174l. In still another embodiment, the target pin icon (e.g., 174c) may be shaded (or colored) and the corresponding signal icon (e.g., 172h) may be shaded (or colored) similarly. Shading, bolding, and/or coloring of the pin icons 174 may be used to indicate various associations, signal characteristic types, power segment types and the like.

Figure 4E:
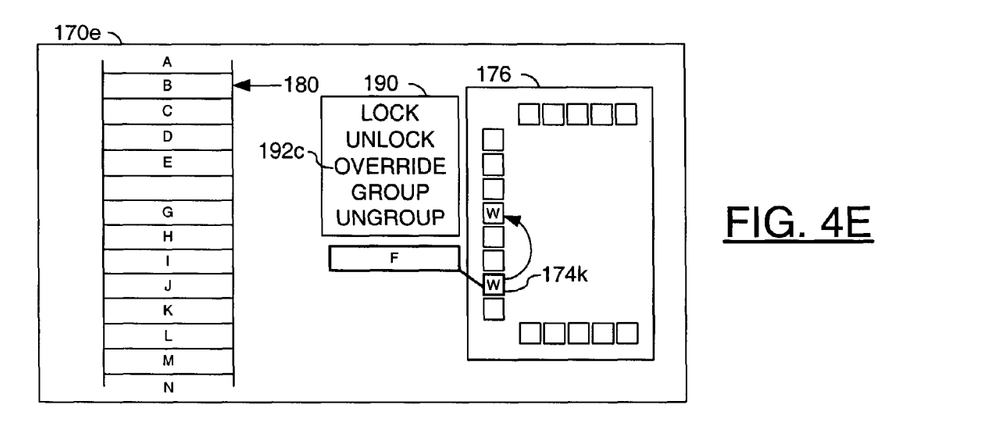

If the user-proposed association between the selected signal icon 172f and the target icon 174k fails the rule check, the user may issue a command (e.g., OVERRIDE) to override the rule check. The command OVERRIDE may be implemented, for example, as a right mouse click causing a small window 190 to appear, followed by a left mouse click selection of an "OVERRIDE" button 192c. Other buttons 192a-192e may be provided in the window 190 to allow the user to issue other commands involving lock, unlock, group, ungroup operations and the like. The command OVERRIDE may instruct the assignment tool to accept the proposed association in the step 162. If the target pin icon 174k already had a previously assigned signal icon (e.g., 172w), the association tool may automatically move the previously assigned signal icon 172w to a neighboring open (unassigned) pin icon 174.

Figure 5:
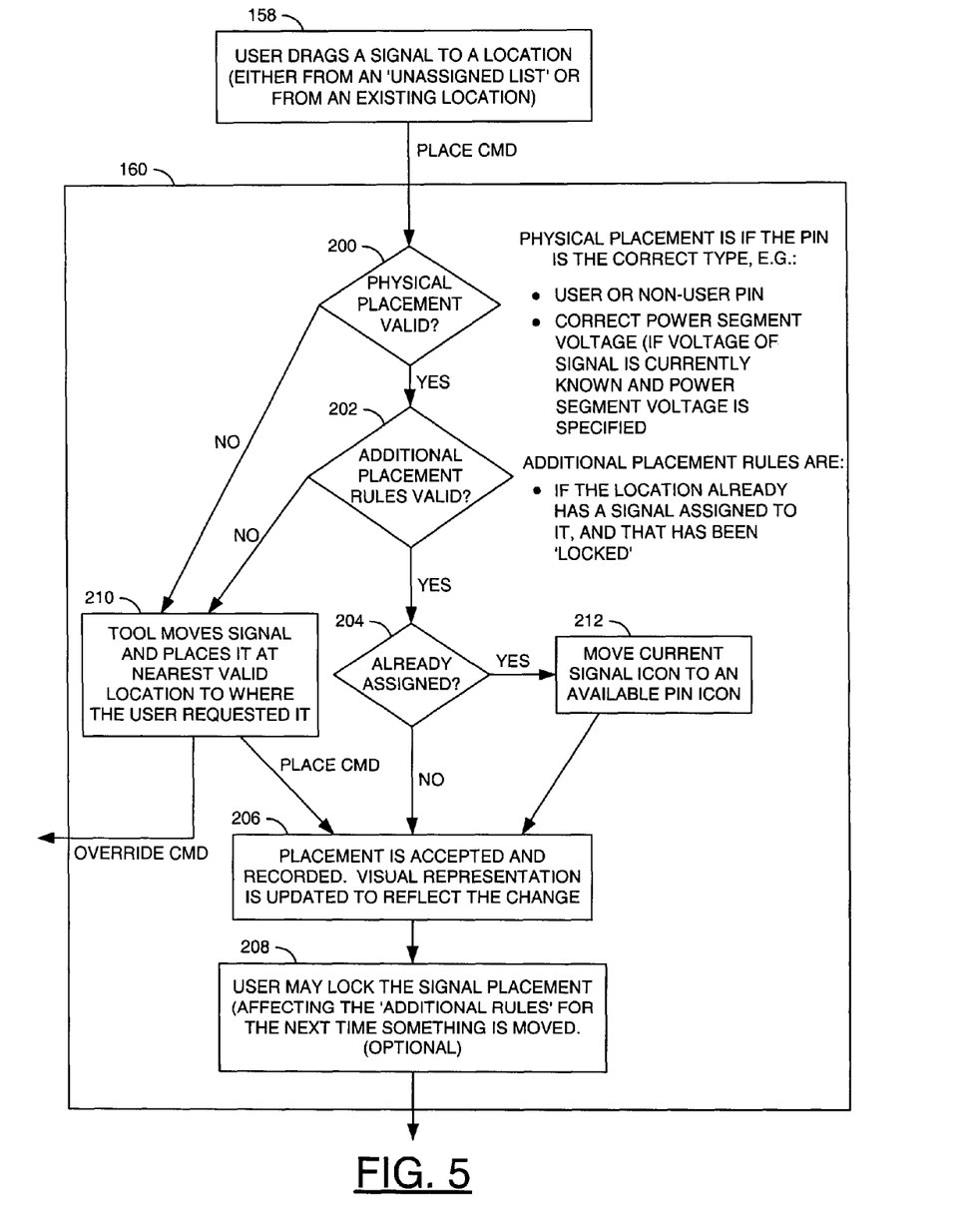
FIG. 5 is a detailed flow diagram for a rule enforcement operation.
Figure 6A:
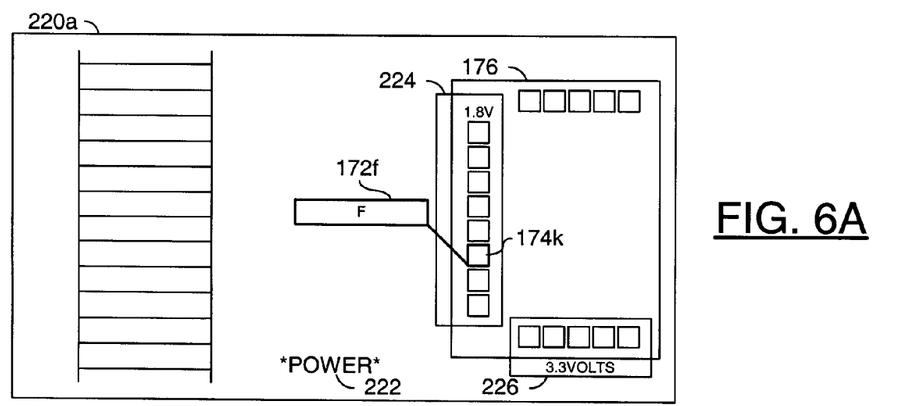
FIGS. 6A-6B are diagrams of example display snapshots generated by the assignment tool for the rule enforcement operation.
Figure 6B:
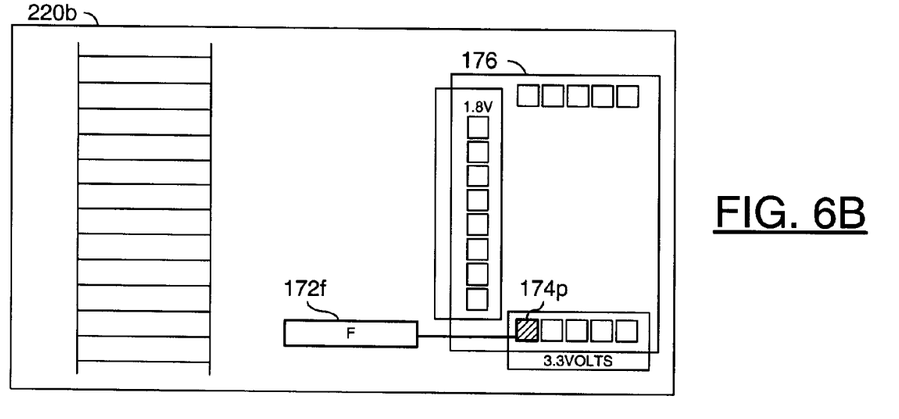

Referring to FIG. 5 and FIGS. 6A-6B, a detailed flow diagram for the rule enforcement step 160 is shown (FIG. 5) and diagrams of example display snapshots (or graphic presentations) 220a-220b generated by the assignment tool are shown (FIGS. 6A-6B). The step (method) 160 generally comprises a step (or block) 200, a step (or block) 202, a step (or block) 204, a step (or block) 206, a step (or block) 208, a step (or block) 210 and a step (or block) 212. The snapshot 220a may illustrate a power segment rule check operation. The snapshot 220b may illustrate an automatic reallocation operation.

Upon the user issuing the command PLACE, the physical placement of the selected signal icon 172f may be checked by the step 200. The physical placement step 200 generally verifies that user has dragged the selected signal icon 172f to a pin icon 174. The physical placement check may also include verifying that the signal icon 172f has the same characteristic type as the target pin icon 174k (e.g., user or nonuser). Furthermore, the physical placement check may also verify that the selected signal icon 172f matches the power segment type of the target pin icon 174k.

If the physical placement is valid (e.g., the YES branch from the step 200), the association tool may perform other rule checks in the step 202. The step 202 may check if the target pin icon 174k is locked or unlocked. If the target pin icon 174k is unlocked (e.g., the YES branch from the step 202), another check may be made for a prior assignment to the target pin icon 174k in the step 204.

If no prior assignment exists (e.g., the NO branch from the step 204), the assignment tool may indicate acceptance of the proposed association between the selected signal icon 172f to target pin icon 174k in the step 206. The association may be recorded in the output file and/or database and the display updated to reflect the acceptance in the step 206.

After the selected signal icon 172f is successfully linked to the target pin icon 174k, the user may issue a command (e.g., LOCK) to lock the association. Locking of the pin icon 174k may affect the addition placement rules tested in the step 202 for the next signal icon 172 to be placed by the user.

If either of the rule checks in the step 200 and the step 202 fail (e.g., the NO branches), the association tool may generate a warning or message 222 (e.g., "POWER") to the user. For example, the selected signal icon 172f may have a power type of 3.3 volts while the target pin icon 174k is within a 1.8 volt power segment (indicated by a box 224). The association tool may fail the physical placement test (step 200) and thus move the selected signal icon 172*f* in the step 210 to a nearest valid location (e.g., pin icon 174*p*) in an appropriate power segment (e.g., a 3.3 volt power segment indicated by a box 226), as illustrated in FIG. 6B. The user may then place the selected signal icon 172*f* at the automatically selected target pin icon 174*p*. If the user wants to place the selected signal icon 172*f* at a different pin icon 174, the user may issue the command MOVE (e.g., drag the selected signal icon 172*f*) in the step 158. The user may move the selected signal icon 172*f* back to the original target pin icon 174*k* and issue the command OVERRIDE to force placement of the selected signal icon 172*f* at the pin icon 174*k*.

If the target pin icon 174*k* already has an associated unlocked signal icon 172 (e.g., the YES branch of step 204), the association tool may automatically move the unlocked signal icon 172 to another open pin icon 174 in the step 212. Placement of the selected signal icon 172*f* may then be accepted in the step 206 as before.

Figure 7A:
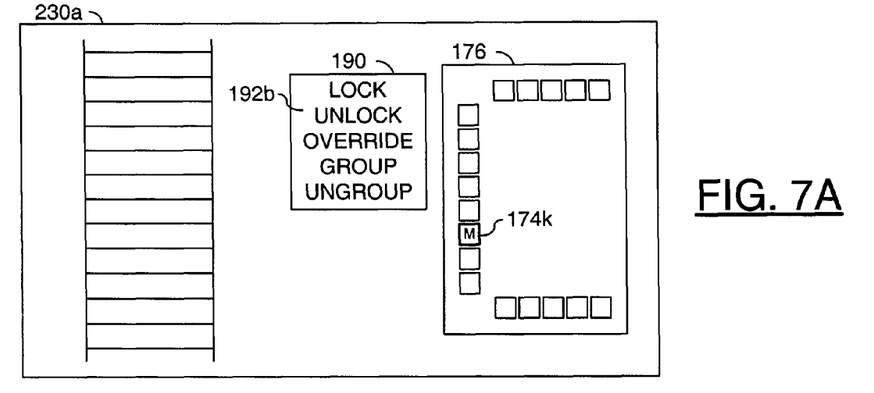
FIGS. 7A-7B are diagrams of example display snapshots for an unlock operation and a lock operation.
Figure 7B:
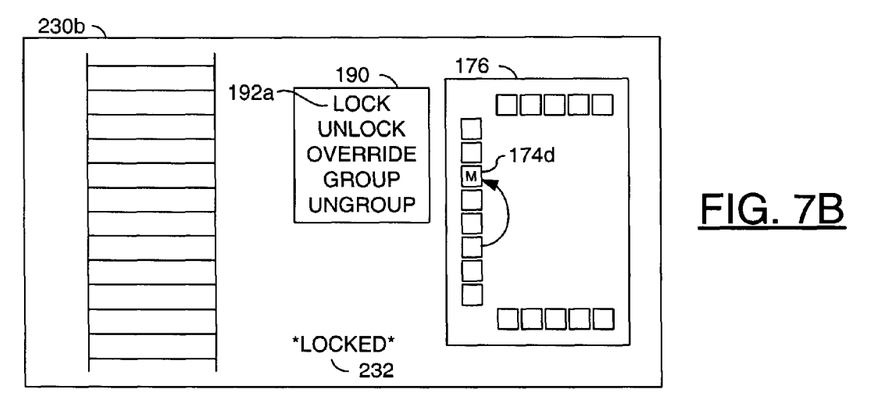

Referring to FIGS. 7A-7B, diagrams of example display snapshots (or graphic presentations) 230*a*-230*b* for an unlock operation and a lock operation are shown. The user may select a particular signal icon (e.g., 172*m*) currently locked to a target pin icon (e.g., 174*k*) with the cursor 178 (not shown). Selection of the locked signal icon/pin icon pair may be implemented by a left mouse click while the cursor 178 is over the signal icon 174*m*. A command (e.g., UNLOCK) may be issued by the user to disassociate the selected signal icon 172*m* from the pin icon 174*k*. The command UNLOCK may be implemented as the button 192*b* within the window 190, as illustrated in FIG. 7A.

The user may then move and place (e.g., drag and drop) the selected signal icon 172*m* from the old pin icon 174*k* to a new pin icon (e.g., 174*d*), as shown in FIG. 7B. While being moved, the selected signal icon 172*m* may be illustrated as disassociated with the original pin icon 174*k* (e.g., see signal icon 172*f* in FIG. 4B). The selected signal icon 172*m* may alternately be moved back to the list 180.

To lock the signal icon 172*m* to the new pin icon 174*d*, the user may issue a command (e.g., LOCK). The command lock may be implemented as the button 192*a* within the window 190. Any attempt to move a locked signal icon 172*m* may result in both (i) a warning or message 232 (e.g., "LOCKED") to the user and (ii) no movement of the locked signal icon 172*m*.

Figure 8:
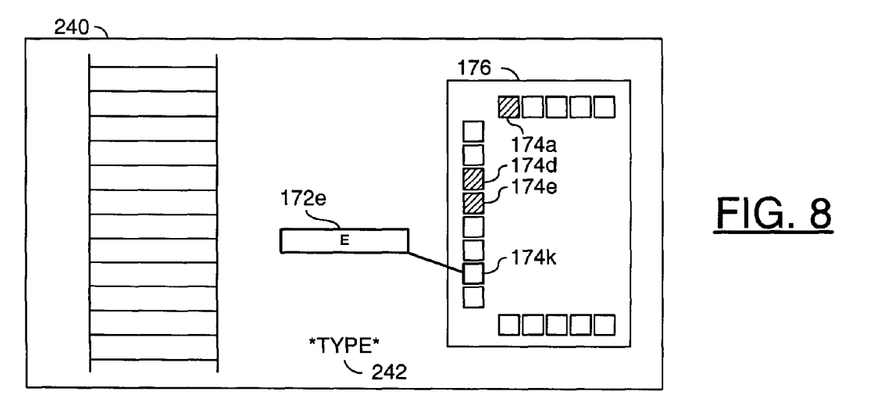
FIG. 8 is a diagram of an example display snapshot for a characteristic type rule check operation.

Referring to FIG. 8, a diagram of an example display snapshot (or graphic presentation) 240 for a characteristic type rule check operation is shown. The user may attempt to associate a selected signal icon (e.g., 172*e*) with a pin icon (e.g., 174*k*) having a different type of characteristic. For example, the selected signal icon 172*e* may have a "user" type characteristic whereas the target pin icon 174*k* may have a "nonuser" type characteristic. The association tool may respond to the attempted placement of the user type signal icon 172*e* with the nonuser type pin icon 174*k* by generating a warning or message 242. For example, a message 242 "TYPE" may indicate that a characteristic type rule checking violation has occurred. The association tool may further aid the user by highlighting unassigned pin icons (e.g., 174*a*, 174*d* and 174*e*) having a characteristic type matching the selected signal icon 172*e*.

Figure 9:
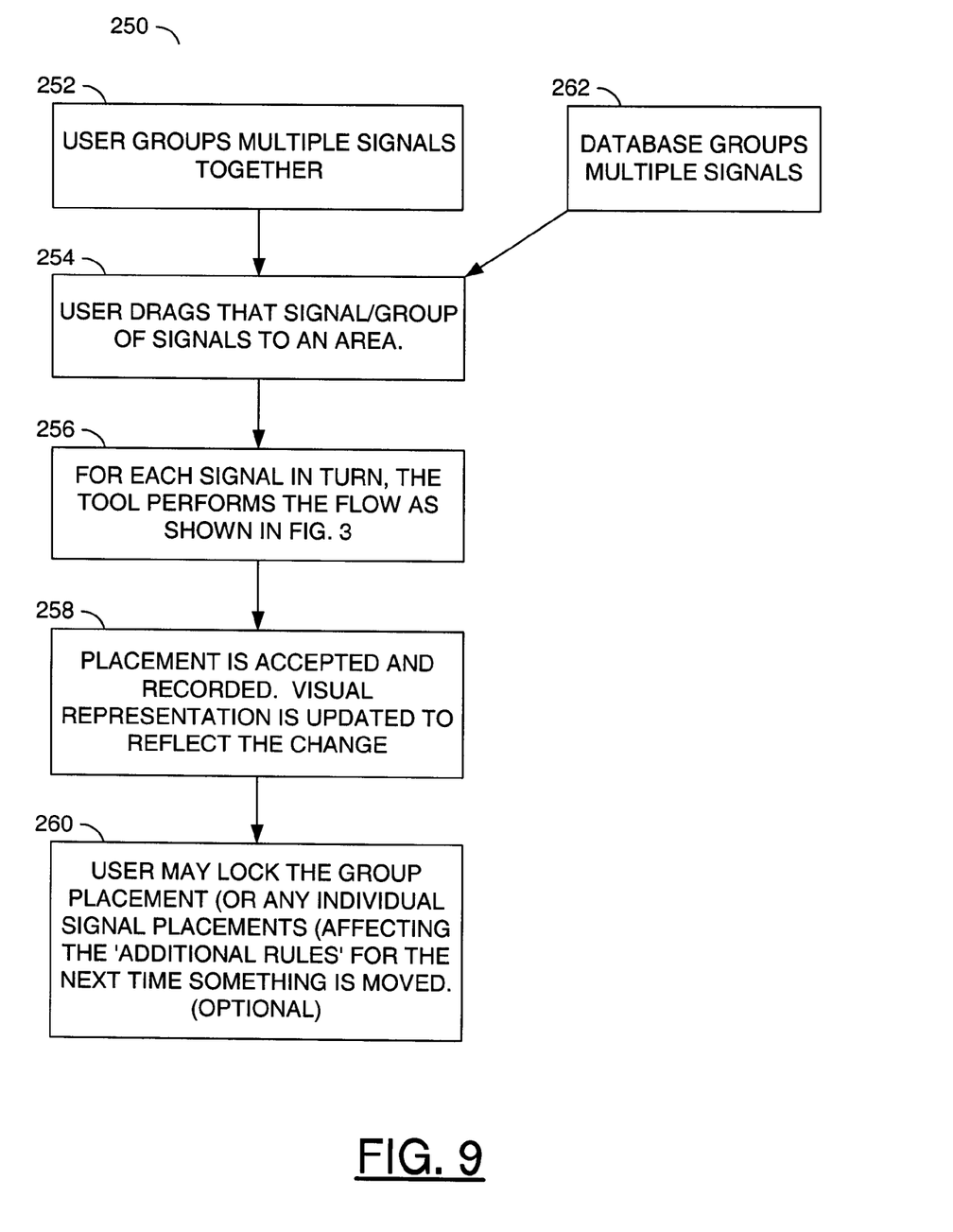
FIG. 9 is a flow diagram of an example method for a group operation.
Figure 10A:
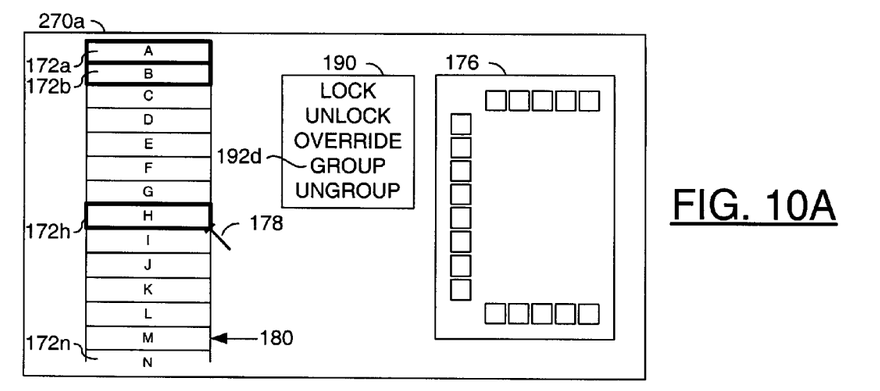
FIGS. 10A-10C are diagrams of example display snapshots for the group operation and an ungroup operation.
Figure 10B:
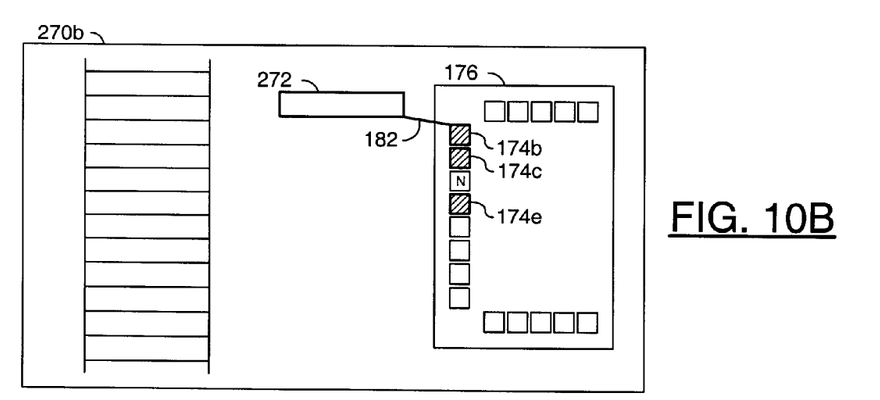

Referring to FIG. 9 and FIGS. 10A-10C, a flow diagram of an example method 250 for a group operation is shown (FIG. 9) and diagrams of example display snapshots (or graphic presentations) 270*a*-270*c* of the group operation and an ungroup operation are shown (FIGS. 10A-10B). The method 250 generally comprises a step (or block) 252, a step (or block) 254, a step (or block) 256, a step (or block) 258, a step (or block) 260 and an optional step (or block) 262. The snapshot 270*a* may illustrate a grouping operation. The snapshot 270*b* may illustrate a group move operation. The snapshot 270*c* may illustrate an ungroup operation.

The method 250 generally begins with the user issuing the command SELECT to multiple signal icons (e.g., 172*a*, 172*b* and 172*h*). Multiple commands SELECT may be implemented by a control key press-and-hold followed by a left mouse click on each signal icon 172 to be included in the signal group. Each signal icon 172 selected to be a part of the signal group may be highlighted as illustrated in FIG. 10A. A command 192*d* (e.g., GROUP) may be issued by the user to group the highlighted signal icons 172*a*, 172*b* and 172*h* into a group icon 272 (FIG. 10B) outside the list 180.

The user may drag the group icon 272 to an intended pin icon (e.g., 174*b*) in the step 254. When the reference line 182 for the signal group icon 272 reaches the target pin icon 174*d*, the assignment tool may highlight the target pin icon 174*d* and other pin icons (e.g., 174*c* and 174*e*) corresponding to the proposed placement of the signal group 272, as illustrated in FIG. 10B. In the example shown, the corresponding pin group may be automatically generated starting at the target pin icon 174*d* and working counterclockwise around the pin icons 174, one pin icon 174 for each of the signal icons 172 in the signal group. A locked signal icon (e.g., 172*n*) may cause the pin group to be split into multiple fragments.

Upon issuing the command PLACE, the association tool may check each proposed association between the signal icons 174*a*, 172*b* and 172*h* with the corresponding pin icons 174*b*, 174*c* and 174*e*, respectively. Each individual signal icon to pin icon association may be checked in accordance with the method 140 (FIG. 3) in the step 256.

If the placement is accepted, the signal icons 172*a*, 172*b* and 172*h* may be displayed as associated with the pin icons 174*b*, 174*c* and 174*e* in the step 258. The user may then optionally lock the group association (e.g., the signal group to the pin group) in the step 260. The user may also lock individual signal icons 172 within the signal group to the respective pin icons 174 in the step 260.

Figure 10C:
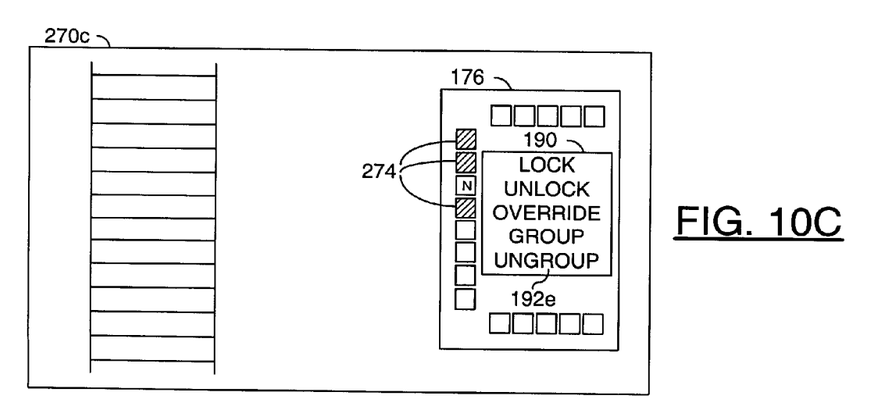

An ungroup operation may be started when the user selects a signal group (e.g., group 274) by selecting any one of the signal icons 172 within the group 274. As shown in FIG. 10C, the signal group 274 may be highlighted when selected by the cursor 178 (not shown). Selection of the signal group 274 may be implemented, for example, by a left mouse click. The user may then command the ungrouping operation by selecting the button 192*e* (e.g., UNGROUP) from the window 190. The ungrouped signal icons 172*a*, 172*b* and 172*h* may remain associated to the respective pin icons 174*b*, 174*c* and 174*e* after being ungrouped.

Figure 11A:
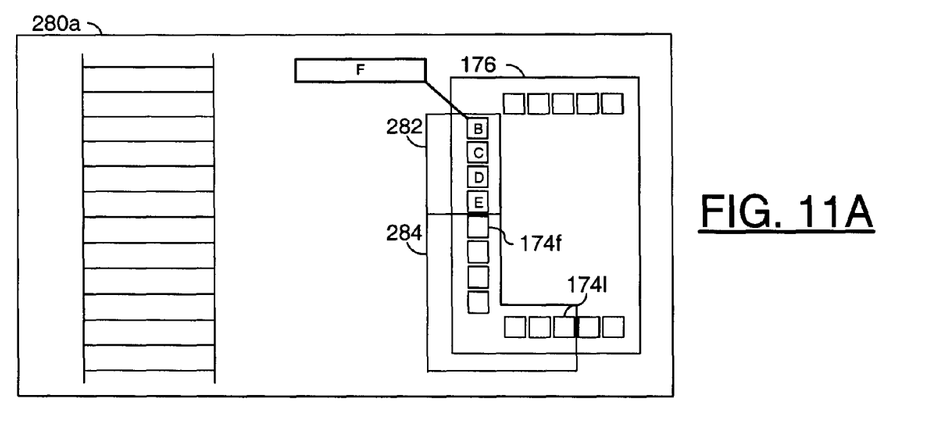
FIGS. 11A-11B are diagrams of example display snapshots for a segment violation move.
Figure 11B:
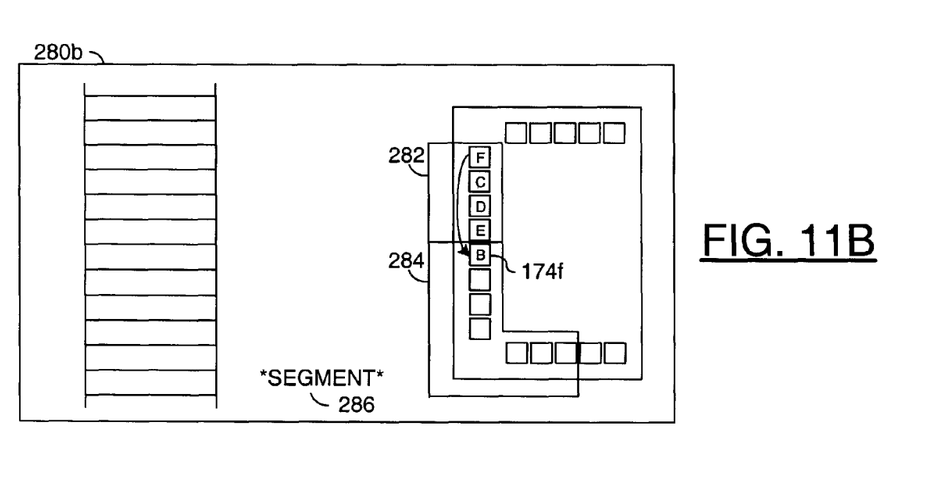

Referring to FIGS. 11A-11B, diagrams of example display snapshots (or graphic presentations) 280*a*-280*b* for a segment violation move are shown. An initial condition may exist in FIG. 11A where several signal icons (e.g., 172*b*-172*e*) have already been assigned to pin icons (e.g., 174*b*-174*e*) and two different segments have been defined (shown by rectangle 282 and polygon 284). The pin icons 174*b*-174*e* may be within the first segment 282. The pin icons 174*f*-174*l* may be within the second segment 284. The segments 282 and 284 may represent power segments, user segments and/or nonuser segments. Other types of segments may be implemented to meet the criteria of a particular application.

The user may attempt to move a new signal icon (e.g., 172*f*) onto an already-assigned pin icon (e.g., 174*b*) within the first segment 282. Assuming that the signal icon 172*b* is unlocked, the association tool may accept the placement of the new signal icon 172*f* on the pin icon 174*b*. Thereafter, the association tool may move the signal icon 172*b* away from the pin icon 174*b* to another available pin icon 174.

In the example, no other pin icons 174 may be available within the segment 282. As such, the automatic move of the signal icon 172*b* may be to an unassigned pin icon (e.g., 174*f*) within the second segment 284. Movement of the signal icon 172*b* outside the first segment 282 may cause the association tool to generate a warning or message 286 to the user. A message (e.g., "SEGMENT") may indicate that an automatic inter-segment move has taken place and the automatically moved signal icon 172*b* may be highlighted.

The user may reconsider the placement of the signal icon 172*f* into the segment 282. The user may also redefine the segments 282 and 284 so that the signal icon 172*b* is again within the first segment 282.

Figure 12:
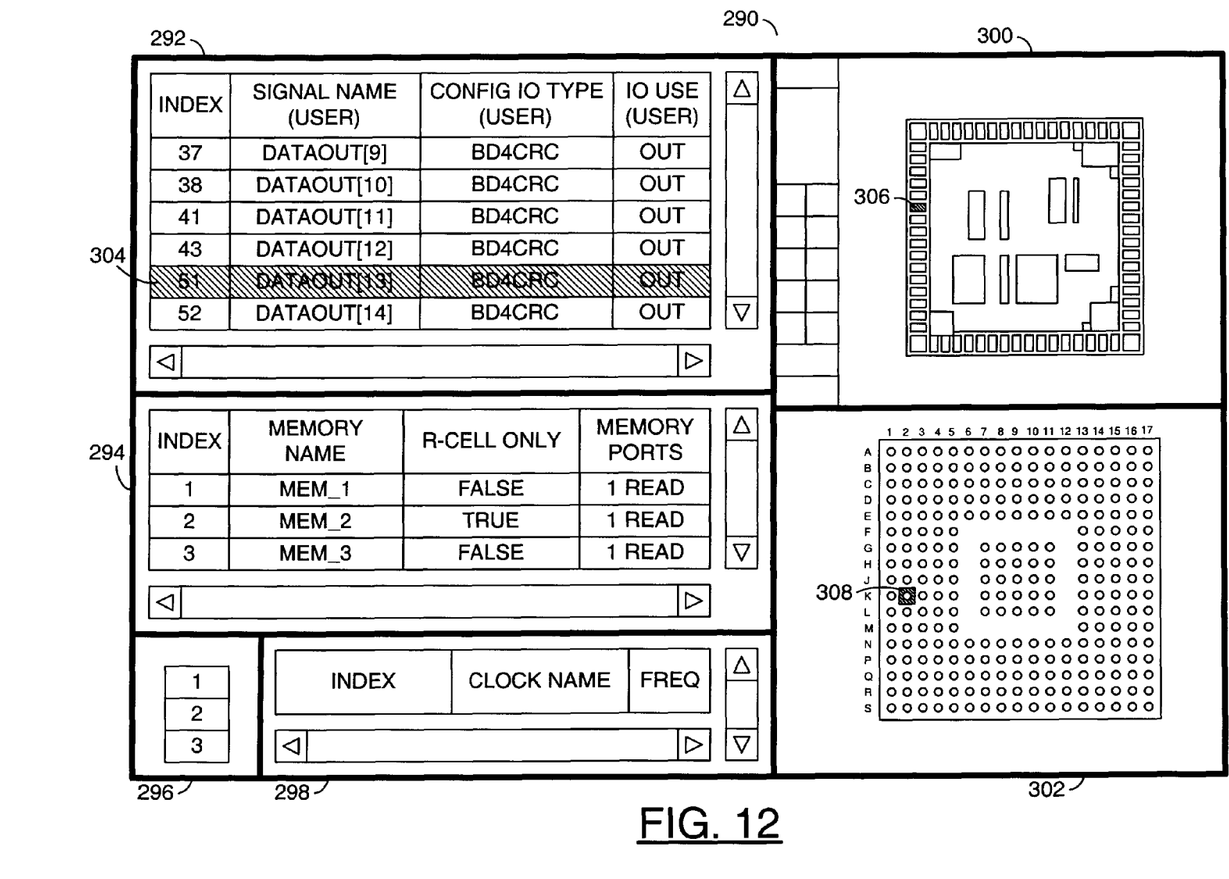
FIG. 12 is a diagram of another example display snapshot generated by the assignment tool.

Referring to FIG. 12, a diagram of example display snapshot (or graphic presentation) 290 generated by the assignment tool is shown. The snapshot 290 generally comprises a I/O specification window 292, a memory specification window 294, a phase lock loop specification window 296, a clock specification window 298, a chip view window 300 and a package pinout window 302. A signal icon 304 shown in the I/O Specification window 292, an associated pad icon 306 shown in the chip view window 300 and an associated pin icon 308 shown in the package pinout window 302 may each be highlighted to illustrate a cross probing linkage between the views. The windows 292, 300 and 302 may allow a user to simultaneously see what signals have been assigned to what pads on a chip, and where the signals appear on the package pins. Movement, locking and unlocking of the assignments may take place as described above.

The function performed by the flow diagrams of FIGS. 3, 5 and 9 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMS, EPROMs, EEPROMS, Flash memory, magnetic or optical cards, or any type of media suitable for storing electronic instructions. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. A method of an input/output assignment planning, comprising the steps of:

(A) generating a graphic presentation to a user using a computer, said graphic presentation displaying (i) a circuit icon having a plurality of pin icons, (ii) a plurality of assigned signal icons each associated with a respective one of said pin icons and (iii) a list having a plurality of unassigned signal icons not presently associated with any of said pin icons;

(B) drag-and-dropping a first of said unassigned signal icons within said graphic presentation from said list to a first of said pin icons in response to a first move command received from said user, said first unassigned signal icon becoming a first additional one of said assigned signals icons in response to being dropped on said first pin icon; and (C) indicating in said graphic presentation a first lock of a first association between said first additional assigned signal icon and said first pin icon in response to a first lock command received from said user.

2. The method according to claim 1, wherein said first lock prevents a manual disassociation of said first additional assigned signal icon from said first pin icon.

3. The method according to claim 1, further comprising a step of:

indicating in said graphic presentation an unlock of said first association in response to an unlock command received from said user.

4. The method according to claim 3, further comprising the step of:

indicating in said graphic presentation a disassociation of said first additional assigned signal icon from said first pin icon in response to a second move command received from said user while said first additional assigned signal icon is unlocked.

5. The method according to claim 1, further comprising the step of:

automatically moving a second of said unassigned signal icons to a second of said pin icons in said graphic presentation in response to a second move command received from said user, said second move command attempting to associate said second unassigned signal icon with said first pin icon while said first pin icon is locked.

6. The method according to claim 1, further comprising the step of:

automatically associating a second of said unassigned signal icons with a second of said pin icons in said graphic presentation in response to an assignment received from a database, said assignment attempting to associate said second unassigned signal icon with said first pin icon while said first pin icon is locked, said second unassigned signal icon becoming a second additional one of said assigned signal icons in response to becoming associated with said second pin icon.

7. The method according to claim 6, further comprising the step of:

indicating in said graphic presentation a second lock of said second additional assigned signal icon with said second pin icon.

8. The method according to claim 1, wherein said first lock prevents an automatic disassociation of said first additional assigned signal icon from said first pin icon.

9. The method according to claim 1, further comprising the step of:

modifying a rule corresponding to said first pin icon to indicate that said first pin icon is locked.

10. The method according to claim 1, further comprising the step of:

highlighting in said graphic presentation at least two of said unassigned signal icons in said list as a signal group in response to a group command received from said user.

11. The method according to claim 10, further comprising the step of:
indicating in said graphic presentation a second association of said signal group to a corresponding pin group of said pin icons in response to a place command received from said user.

12. The method according to claim 11, further comprising the step of:
indicating in said graphic presentation a second lock between said signal group and said pin group in response to a second lock command received from said user.

13. The method according to claim 1, wherein the steps are preformed by processor executable instructions contained within a computer readable medium.

14. A method of an input/output assignment planning, comprising the steps of:
(A) generating a graphic presentation to a user using a computer, said graphic presentation displaying (i) a circuit icon having a plurality of pin icons, (ii) a plurality of assigned signal icons each associated with a respective one of said pin icons and (iii) a list having a plurality of unassigned signal icons not presently associated with any of said pin icons;
(B) highlighting in said graphic presentation at least two of said unassigned signal icons as a signal group in response to a group command received from said user; and
(C) indicating in said graphic presentation (i) an association of said signal group to a corresponding pin group of said pin icons in response to a place command received from said user and (ii) a lock between said signal group and said pin group in response to a lock command received from said user.

15. The method according to claim 14, further comprising the step of:
moving a particular one of said assigned signal icons currently associated with a first of said pin icons within said pin group to a second of said pin icons outside said pin group in response to said association of said signal group with said pin group.

16. The method according to claim 15, further comprising the step of:
displaying in said graphic presentation a warning if said second pin icon is outside a boundary.

17. The method according to claim 16, wherein said boundary defines a power segment in which all of said pin icons have a common voltage characteristic.

18. The method according to claim 14, wherein said pin group comprises at least two subgroups non-adjoining each other.

19. The method according to claim 14, wherein the steps are preformed by processor executable instructions contained within a computer readable medium.

* * * * *